United States Patent
Adachi

(10) Patent No.: US 11,024,760 B2
(45) Date of Patent: Jun. 1, 2021

(54) CRYSTALLINE SILICON SOLAR CELL AND METHOD FOR PRODUCING SAME

(71) Applicant: KANEKA CORPORATION, Osaka (JP)

(72) Inventor: Daisuke Adachi, Osaka (JP)

(73) Assignee: KANEKA CORPORATION, Osaka (JP)

( * ) Notice: Subject to any disclaimer, the term of this patent is extended or adjusted under 35 U.S.C. 154(b) by 0 days.

(21) Appl. No.: 16/234,826

(22) Filed: Dec. 28, 2018

(65) Prior Publication Data

US 2019/0140119 A1     May 9, 2019

Related U.S. Application Data

(63) Continuation of application No. PCT/JP2017/023829, filed on Jun. 28, 2017.

(30) Foreign Application Priority Data

Jun. 30, 2016 (JP) .............................. JP2016-130762

(51) Int. Cl.
    *H01L 31/0352*       (2006.01)
    *H01L 31/0747*       (2012.01)
    (Continued)

(52) U.S. Cl.
    CPC .... *H01L 31/03529* (2013.01); *H01L 31/0236* (2013.01); *H01L 31/02363* (2013.01);
    (Continued)

(58) Field of Classification Search
    CPC ........... H01L 31/03529; H01L 31/0236; H01L 31/02363; H01L 31/02366
    See application file for complete search history.

(56) References Cited

U.S. PATENT DOCUMENTS

| 5,549,763 A * | 8/1996 | Sano .................... H01L 31/202 |
| | | 136/255 |
| 6,207,890 B1 | 3/2001 | Nakai et al. |
| 2010/0006147 A1 | 1/2010 | Nakashima et al. |

(Continued)

FOREIGN PATENT DOCUMENTS

| JP | 2008-091531 A | 4/2008 |
| JP | 2014-192370 A | 10/2014 |

(Continued)

OTHER PUBLICATIONS

Machine translation of JP 2014-229876; accessed and printed Mar. 28, 2020 (Year: 2014).*

(Continued)

*Primary Examiner* — Edward J. Schmiedel
(74) *Attorney, Agent, or Firm* — Osha Bergman Watanabe & Burton LLP

(57) ABSTRACT

A crystalline silicon-based solar cell includes, in the following order, a crystalline silicon substrate having a first principal surface, a non-single-crystalline silicon-based thin-film, and a transparent electroconductive layer. The non-single-crystalline silicon-based thin-film and the transparent electroconductive layer are disposed on the first principal surface. The non-single-crystalline silicon-based thin-film comprises, in the following order from the first principal surface, an intrinsic silicon-based thin-film and a conductive silicon-based thin-film. The first principal surface has a plurality of pyramidal projections, each having a top portion, a middle portion, and a bottom portion. A thickness of the non-single-crystalline silicon-based thin-film disposed on the top portions is smaller than a thickness of the non-single-crystalline silicon-based thin-film disposed on the middle portions.

14 Claims, 5 Drawing Sheets

(51) Int. Cl.
*H01L 31/0236* (2006.01)
*H01L 31/0224* (2006.01)
*H01L 31/18* (2006.01)
*H01L 31/20* (2006.01)

(52) U.S. Cl.
CPC .. *H01L 31/022475* (2013.01); *H01L 31/0747* (2013.01); *H01L 31/1888* (2013.01); *H01L 31/202* (2013.01); *Y02E 10/50* (2013.01)

(56) References Cited

U.S. PATENT DOCUMENTS

| | | | | |
|---|---|---|---|---|
| 2011/0315214 | A1* | 12/2011 | Yamanobe | C03C 17/3618 136/256 |
| 2012/0085397 | A1 | 4/2012 | Kim et al. | |
| 2014/0308773 | A1* | 10/2014 | Niu | H01L 31/20 438/94 |

FOREIGN PATENT DOCUMENTS

| | | |
|---|---|---|
| JP | 2014-229876 A | 12/2014 |
| WO | 1998/43304 A1 | 10/1998 |

OTHER PUBLICATIONS

International Preliminary Report on Patentability issued in International Application No. PCT/JP2017/023829 dated Jan. 10, 2019 (6 pages).
International Search Report issued in International Application No. PCT/JP2017/023829, dated Aug. 22, 2017 (1 page).
Written Opinion issued in International Application No. PCT/JP2017/023829, dated Aug. 22, 2017 (3 pages).
Office Action issued in Japanese Application No. 2018-525236, dated Sep. 2019 (4 pages).

* cited by examiner

CRYSTALLINE SILICON SOLAR CELL AND METHOD FOR PRODUCING SAME

TECHNICAL FIELD

One or more embodiments of the present invention relate to a crystalline silicon-based solar cell having a heterojunction on a crystalline silicon substrate surface, and manufacturing method thereof.

BACKGROUND

In a crystalline silicon-based solar cell including a crystalline silicon substrate, pyramidal projections-recesses are formed on a surface of the substrate by, for example, anisotropic etching of crystalline silicon, so that light reflection is reduced (so called light confinement). Accordingly, light utilization efficiency at the crystalline silicon substrate is increased to improve the current density of the solar cell.

In a solar cell (heterojunction solar cell) including a non-single-crystalline silicon-based thin-film of amorphous silicon or the like on a surface of a crystalline silicon substrate, a passivation effect for defects on the surface of the crystalline silicon substrate is attained by disposing an intrinsic silicon-based thin-film between the crystalline silicon substrate with projections-recesses and a conductive silicon-based thin-film.

A silicon-based thin-film such as an intrinsic silicon-based thin-film is generally formed by a plasma-enhanced chemical vapor deposition (CVD) method. The silicon thin-film formed by the plasma-enhanced CVD method on a crystalline silicon substrate having projection-recess structure generally tends to have a relatively large thickness at projection tip (top) portions and a small thickness on valley portions thereof. Patent Document 1 suggests that when etching is performed so as to round valley portions during formation of projection-recess structure on a surface of a crystalline silicon substrate, the thickness of an amorphous silicon thin-film formed thereon can be made uniform.

Patent Document 1: WO 98/43304

In a heterojunction solar cell, an intrinsic silicon-based thin-film disposed between a crystalline silicon substrate and a conductive silicon-based thin-film has an open circuit voltage improving effect associated with a passivation effect on the crystalline silicon substrate. On the other hand, the intrinsic silicon-based thin-film does not contribute directly to production or collection of photoexcited carriers, and therefore an increase in thickness of the intrinsic silicon-based thin-film may cause reduction of the current density due to absorption of light by the intrinsic silicon-based thin-film, and reduction of the fill factor which is ascribable to series resistance. In other words, when the thickness of the intrinsic silicon-based thin-film disposed on a surface of the crystalline silicon substrate increases, there is a trade-off relationship between a positive factor associated with passivation and a negative factor associated with series resistance and absorption of light. There is the same trade-off relationship as described above even when the thickness of the silicon-based thin-film is made uniform as in Patent Document 1.

SUMMARY

In view of the above-mentioned properties, one or more embodiments of the present invention further improve the efficiency of a heterojunction solar cell.

The present inventor has found that, in one or more embodiments of the present invention, when a silicon-based thin-film has a specific thickness distribution along the inclined surfaces of projections on a surface of a crystalline silicon substrate, a high passivation effect is maintained, and simultaneously an electrical loss resulting from series resistance is reduced, so that the conversion efficiency of a solar cell can be improved.

One or more embodiments of the present invention relate to a crystalline silicon-based solar cell including a non-single-crystalline silicon-based thin-film and a transparent electroconductive layer on a first principal surface of a crystalline silicon substrate. The non-single-crystalline silicon-based thin-film includes an intrinsic silicon-based thin-film and a conductive silicon-based thin-film. The crystalline silicon substrate has pyramidal projections-recesses (or "pyramidal projections") on the first principal surface. The average height of projections of the pyramidal projections-recesses provided on the surface of the crystalline silicon substrate is preferably 0.5 to 10 µm.

In one or more embodiments of the present invention, the thickness of the non-single-crystalline silicon-based thin-film disposed on the projection top portion is smaller than the thickness of the non-single-crystalline silicon-based thin-film disposed on the projection middle portion. The thickness of the non-single-crystalline silicon-based thin-film disposed on the projection top portion is preferably within a range of 0.75 to 0.95 times the thickness of the non-single-crystalline silicon-based thin-film disposed on the projection middle portion.

In one or more embodiments of the present invention, it is preferable that the intrinsic silicon-based thin-film has a specific thickness distribution along the inclined surfaces of the projections. The thickness of the intrinsic silicon-based thin-film disposed on the projection top portion is preferably within a range of 0.5 to 0.9 times the thickness of the intrinsic silicon-based thin-film disposed on the projection middle portion. In manufacturing of the crystalline silicon-based solar cell, it is preferable that an intrinsic silicon-based thin-film having such a thickness distribution is formed, and a conductive silicon-based thin-film is then deposited thereon.

In one or more embodiments of the present invention, the ratio of the thickness $d_2$ of the intrinsic silicon-based thin-film disposed on the projection top portion to the thickness $d_1$ of the intrinsic silicon-based thin-film disposed on the projection middle portion ($d_2/d_1$) is preferably smaller than the ratio of the thickness $D_2$ of the conductive silicon-based thin-film disposed on the projection top portion to the thickness $D_1$ of the conductive silicon-based thin-film disposed on the projection middle portion ($D_2/D_1$). The ratio $d_2/d_1$ is preferably within a range of 0.5 to 0.9 times the ratio $D_2/D_1$.

In one or more embodiments of the present invention, the thickness of the non-single-crystalline silicon-based thin-film disposed on the projection bottom portion is preferably smaller than the thickness of the non-single-crystalline silicon-based thin-film disposed on the projection middle portion. The thickness of the non-single-crystalline silicon-based thin-film disposed on the projection bottom portion is preferably within a range of 0.75 to 0.95 times the thickness of the non-single-crystalline silicon-based thin-film disposed on the projection middle portion.

In one or more embodiments of the present invention, the ratio ($d_3/d_1$) of the thickness $d_3$ of the intrinsic silicon-based thin-film disposed on the projection bottom portion to the thickness $d_1$ of the intrinsic silicon-based thin-film disposed on the projection middle portion is preferably smaller than the ratio ($D_3/D_1$) of the thickness $D_3$ of the conductive silicon-based thin-film disposed on the projection bottom portion to the thickness $D_1$ of the conductive silicon-based thin-film disposed on the projection middle portion. The ratio $d_3/d_1$ is preferably within a range of 0.5 to 0.9 times the ratio $D_3/D_3/D_1$.

In a crystalline silicon-based solar cell of one or more embodiments of the present invention, a silicon-based thin-film disposed on projection-recess structure of a crystalline silicon substrate has a specific thickness distribution, and thus high conversion efficiency can be achieved.

DETAILED DESCRIPTION OF THE EMBODIMENTS

Figure 1:
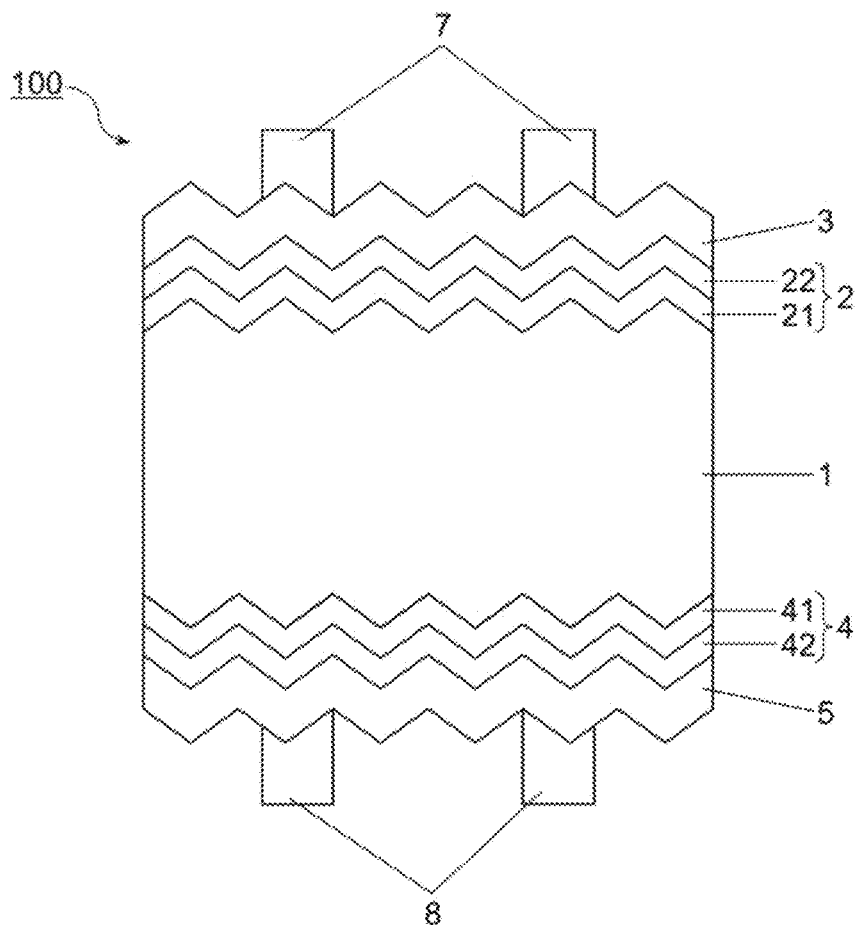
FIG. 1 is a schematic sectional view showing a crystalline silicon-based solar cell according to one or more embodiments of the present invention.

FIG. 1 is a schematic sectional view showing a crystalline silicon-based solar cell (heterojunction solar cell) according to one or more embodiments of the present invention. A heterojunction solar cell 100 includes a first non-single-crystalline silicon-based thin-film 2 on a first principal surface of a crystalline silicon substrate 1, and a first transparent electroconductive layer 3 on the first non-single-crystalline silicon-based thin-film 2. The first non-single-crystalline silicon-based thin-film 2 has a configuration in which a first intrinsic silicon-based thin-film 21 and a first conductive silicon-based thin-film 22 are stacked in this order from the crystalline silicon substrate 1 side. It is to be noted that the "non-single-crystalline silicon" conceptually encompasses amorphous silicon, microcrystalline silicon (amorphous silicon including crystalline silicon) and polycrystalline silicon.

In one or more embodiments of the present invention, a second non-single-crystalline silicon-based thin-film 4 is disposed on a second principal surface of the crystalline silicon substrate 1, and a second transparent electroconductive layer 5 is disposed on the second non-single-crystalline silicon-based thin-film 4. The second non-single-crystalline silicon-based thin-film 4 has a configuration in which a second intrinsic silicon-based thin-film 41 and a second conductive silicon-based thin-film 42 are stacked in this order from the crystalline silicon substrate 1 side.

As the crystalline silicon substrate 1, a single-crystalline silicon substrate or a multicrystalline silicon substrate is used. For improving the conversion efficiency of the solar cell, a single-crystalline silicon substrate is preferably used. The conductivity-type of the crystalline silicon substrate 1 may be either an n-type or a p-type. The first conductive silicon-based thin-film 22 and the second conductive silicon-based thin-film 42 have different conductivity-types, where one of the conductive silicon-based thin-films is p-type, and the other is n-type. From the viewpoint of improving conversion efficiency, the heterojunction solar cell with an electrode on both sides as shown in FIG. 1 preferably has a configuration in which the crystalline silicon substrate 1 is an n-type single-crystalline silicon substrate and a p-type silicon-based thin-film-formed surface is a light-receiving surface.

In one or more embodiments of the present invention, the crystalline silicon substrate 1 has pyramidal projections-recesses on at least a surface on the light-receiving side. The pyramidal projections-recesses is formed by, for example, subjecting a surface of the single-crystalline silicon substrate to anisotropic etching treatment. By forming projection-recess structure on a surface of the crystalline silicon substrate, light reflection is reduced, so that light utilization efficiency at the crystalline silicon substrate is improved.

By disposing intrinsic silicon-based thin-films 21 and 41 on the surfaces of the crystalline silicon substrate 1 of one or more embodiments, diffusion of impurities to the crystalline silicon substrate is suppressed, and simultaneously surface passivation is effectively achieved, so that the open circuit voltage of the solar cell can be improved. The intrinsic silicon-based thin-film is a silicon-based thin-film which does not contain a dopant, or has an extremely low dopant concentration. Specifically, the dopant concentration of each of the intrinsic silicon-based thin-films 21 and 41 is not more than 1/20 of the dopant concentration of the p-type or n-type silicon-based thin-film 22 or 42. The dopant concentration of each of the intrinsic silicon-based thin-films 21 and 41 is preferably not more than 1/100 of the dopant concentration of each of conductive silicon-based thin-films 22 and 42. It is especially preferable that, the intrinsic silicon-based thin-films 21 and 41 do not contain a dopant. It is preferable that the intrinsic silicon-based thin-films 21 and 41 are composed of hydrogenated amorphous silicon for improving the passivation effect.

In one or more embodiments of the present invention, the thickness of the intrinsic silicon-based thin-film is preferably 2 to 15 nm, more preferably 3 to 12 nm, further preferably 4 to 10 nm. When the thickness of the intrinsic silicon-based thin-film is excessively small, the passivation effect on the crystalline silicon substrate may be insufficient. On the other hand, when the thickness of the intrinsic silicon-based thin-film is excessively large, series resistance or absorption of light may increase, resulting in deterioration of conversion characteristics. As described later, it is preferable that the thickness of the intrinsic silicon-based thin-film is set so as to maximize conversion efficiency with consideration given to a positive factor such as improvement of the passivation effect due to an increase in film thickness and a negative factor associated with an increase in series resistance and absorption of light. The silicon-based thin-film has a thickness distribution along the inclined surfaces of projections of the crystalline silicon substrate. The thickness of the silicon-based thin-film in this specification refers to a thickness $d_m$ on the middle portion unless otherwise specified.

Examples of the conductive silicon-based thin-films 22 and 42 include amorphous silicon-based thin-films and microcrystalline silicon-based thin-films. As the silicon-based thin-film, silicon-based alloys such as silicon oxide, silicon carbide and silicon nitride can be used besides silicon. Among them, amorphous silicon is preferable. The thickness of each of the conductive silicon-based thin-films 22 and 42 is preferably about 3 to 30 nm.

As a method for depositing intrinsic silicon-based thin-films 21 and 31 and conductive silicon-based thin-films 22 and 42, in one or more embodiments a plasma-enhanced (ND method is preferable. As conditions for depositing a silicon-based thin-film by the plasma-enhanced CVD method, it is preferable that the substrate temperature is 100 to 300° C., the pressure is 20 to 2600 Pa, and the high-frequency power density is 0.003 to 0.5 W/cm$^2$. For deposition of the silicon-based thin-film, a silicon-containing gas such as SiH$_4$ or Si$_2$H$_6$, or a mixture of such a gas with H$_2$ is used. By adjusting the ratio between the silicon-containing gas and hydrogen to be introduced into a CVD chamber, the thickness and quality of the silicon-based thin-film can be adjusted. For forming an amorphous silicon thin-film, the ratio of the introduced amount of the hydrogen gas to that of the silicon-containing gas (hydrogen dilution ratio) is preferably 10 or less. Microcrystalline silicon tends to be produced when the hydrogen dilution ratio is increased. The hydrogen dilution ratio in formation of the microcrystalline silicon-based thin-film is set to, for example, about 30 to 100. As a dopant gas for forming a p-layer or n-layer, B$_2$H$_6$, PH$_3$ or the like is preferably used.

In the heterojunction solar cell according to one or more embodiments of the present invention, the thickness $d_t$ of the non-single-crystalline silicon-based thin-film disposed on the projection top portion on a surface of the crystalline silicon substrate is smaller than the thickness $d_m$ of the non-single-crystalline silicon-based thin-film disposed on projection middle portion. In addition, the thickness $d_b$ of the non-single-crystalline silicon-based thin-film disposed on the projection bottom portion is preferably smaller than the thickness $d_m$ of the non-single-crystalline silicon-based thin-film disposed on the projection middle portion.

The thickness of the non-single-crystalline silicon-based thin-film 2 is the total thickness of the intrinsic silicon-based thin-film 21 and the conductive silicon-based thin-film 22 disposed on one principal surface of the crystalline silicon substrate 1. The "thickness" refers to a thickness on a deposition surface. The thickness of a silicon-based thin-film formed on the crystalline silicon substrate 1 provided with pyramidal projections is determined by cross-section observation with the thickness direction being a normal direction to the inclined surfaces of the projections.

When the silicon-based thin-film has a thickness distribution along an inclined surface of the pyramidal projection, the thickness often locally varies in regions in the vicinity of the top and vicinity of the bottom. Therefore, a middle region occupying 4/6 of the projection in the height direction is defined as a middle portion, and other regions each occupying 1/6 of the projection in the height direction are defined as a top portion and a bottom portion, respectively. In other words, when the projection is divided into 6 equal parts in the height direction, a region which is situated on the surface side and occupies 1/6 of the projection is the "top portion", a region which is the farthest from the surface and occupies 1/6 of the projection is the "bottom portion", and a region which is situated between the top portion and bottom portion and occupies 4/6 of the projection is the middle portion. (See FIG. 2).

Figure 2:
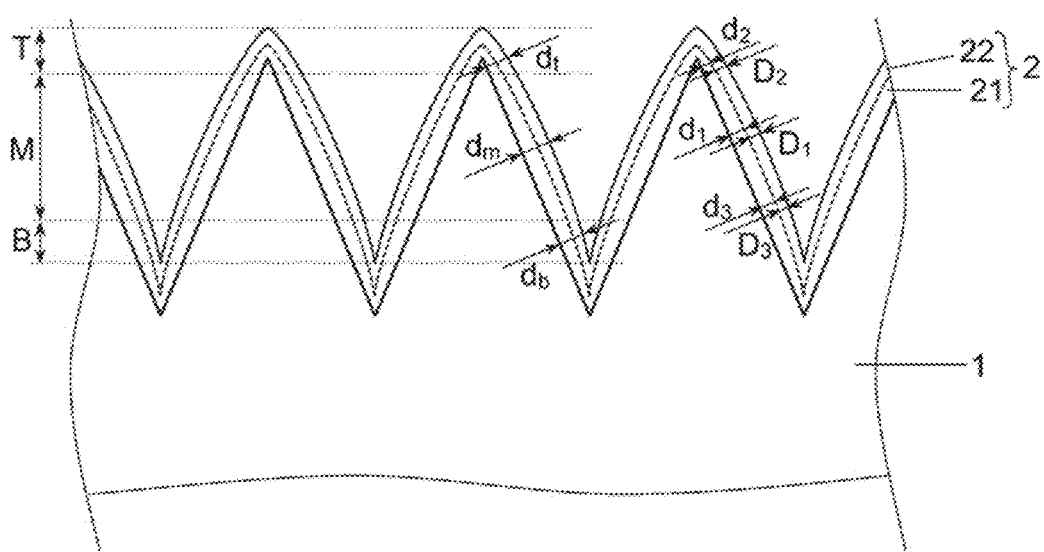
FIG. 2 is a schematic diagram showing a state according to one or more embodiments of the present invention in which a non-single-crystalline silicon-based thin-film is formed on a crystalline silicon substrate.

The thickness of the silicon-based thin-film at each of the projection top portion, the projection middle portion and the projection bottom portion is the thickness of the silicon-based thin-film at the center of a corresponding region in the height direction. In other words, when the projection is divided into 12 equal parts in the height direction, the thickness at a part apart from the surface by 1/12 is a thickness on the top portion, the thickness at a part apart from the surface by 6/12 (1/2) is a thickness on the middle portion, and the thickness at a part apart from the surface by 11/12 is a thickness on the bottom portion. When the projection has a square pyramid shape, the area ratio among the top portion, the middle portion and the bottom portion is 1 (2.8%):24 (66.7%):11 (30.5%). In FIG. 2, the thickness of the silicon-based thin-film is emphasized, and therefore the positions of the bottom and the top on the crystalline silicon substrate seem considerably different from the positions of the bottom and the top on the silicon-based thin-film, respectively. On a real scale, the thickness of the silicon-based thin-film is not more than 1/100 of the height of the texture, and in determination of a thickness measuring position (position at 1/12 of the height of the texture), the positions of the bottom and the top on the crystalline silicon substrate may be considered identical to the positions of the bottom and the top on the silicon-based thin-film, respectively.

In the heterojunction solar cell according to one or more embodiments of the present invention, the silicon-based thin-film disposed on the inclined surface of pyramidal projection has a thickness distribution along the inclined surfaces. Since about 67% of the area of the inclined surface of the projection corresponds to the middle portion, the overall thickness (average thickness) of the silicon-based thin-film is dominated by the thickness of the middle portion. Therefore, the thickness of the silicon-based thin-film on the middle portion is a dominant factor of the passivation effect on the crystalline silicon substrate. On the other hand, the series resistance of the silicon-based thin-film may largely depend on the minimum film thickness as described below. In one or more embodiments of the present invention, reduction of the fill factor, which is ascribable to series resistance, can be suppressed by increasing the thickness of the silicon-based thin-film on middle portion to improve the passivation effect while decreasing the film thickness on top portion.

FIG. 2 is a schematic diagram showing a state, in accordance with one or more embodiments, in which the non-single-crystalline silicon-based thin-film 2 including the intrinsic silicon-based thin-film 21 and the conductive silicon-based thin-film 22 is formed on the crystalline silicon substrate 1 having pyramidal projections-recesses. In the one or more embodiments depicted in FIG. 2, the thickness $d_t$ of the silicon-based thin-film at a top portion T and the thickness $d_b$ of the silicon-based thin-film at a bottom portion B are each smaller than the thickness $d_m$ of the silicon-based thin-film at a middle portion M.

Figure 3:
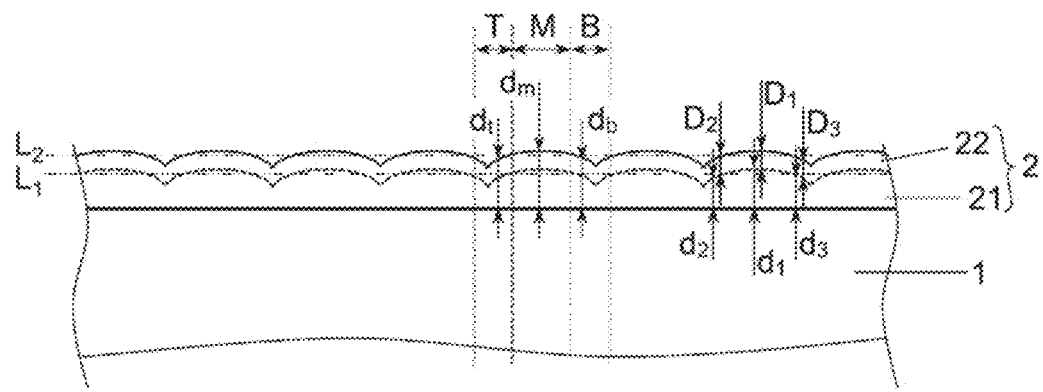
FIG. 3 is a schematic diagram showing a thickness distribution of a silicon-based thin-film on the crystalline silicon substrate according to one or more embodiments of the present invention.

FIG. 3 is a diagram schematically showing a thickness distribution of the silicon-based thin-film along the inclined surface of the texture in FIG. 2. An imaginary line $L_1$ is an average line of surface roughness of the intrinsic silicon-based thin-film 21, and an imaginary line $L_2$ is an average line of surface roughness of the non-single-crystalline silicon-based thin-film 2 (conductive silicon-based thin-film 22).

In the form shown in FIGS. 2 and 3, the thickness $D_1$ at the middle portion M, the thickness $D_2$ on the top portion T and the thickness $D_3$ on the bottom portion B are almost constant in the conductive silicon-based thin-film 22, and the thickness $d_1$ on the middle portion M is larger than each of the thickness $d_2$ on the top portion T and the thickness $d_3$ on the bottom portion B in the intrinsic silicon-based thin-film 21. In other words, a thickness distribution is generated in the non-single-crystalline silicon-based thin-film 2 due to a thickness distribution of the intrinsic silicon-based thin-film along the inclined surfaces of projections.

Comparison between a case where the intrinsic silicon-based thin-film has a thickness distribution along the inclined surfaces of projections as shown in FIGS. 2 and 3 and a case where the intrinsic silicon-based thin-film has no thickness distribution as shown with the imaginary lines $L_1$ and $L_2$ shows that there is no difference in average thickness of the intrinsic silicon-based thin-film between both the cases. In the case where the intrinsic silicon-based thin-film has a thickness distribution, there is a location-dependent distribution of the light absorption amount, but when an average is taken over all of the top portions, middle portions and bottom portions, there is little difference in light absorption amount depending on whether or not the intrinsic silicon-based thin-film has a thickness distribution. Therefore, as long as there is no difference in average thickness of the intrinsic silicon-based thin-film, there is little difference in current density of the heterojunction solar cell irrespective of whether or not the intrinsic silicon-based thin-film has a thickness distribution.

The same applies to a passivation effect on a surface of the crystalline silicon substrate by the intrinsic silicon-based thin-film, and when an average is taken over all of the top portions, middle portions and bottom portions, there is little difference in light absorption amount depending on whether or not the intrinsic silicon-based thin-film has a thickness distribution. Therefore, as long as there is no difference in average thickness of the intrinsic silicon-based thin-film, there is little difference in open circuit voltage of the heterojunction solar cell irrespective of whether or not the intrinsic silicon-based thin-film has a thickness distribution.

On the other hand, as long as there is no difference in average thickness of the intrinsic silicon-based thin-film, series resistance tends to be smaller when a thickness distribution is present than when the thickness is uniform. Photoexcited carriers generated in the crystalline silicon substrate tend to flow intensively to regions having small series resistance. Therefore, when the intrinsic silicon-based thin-film has a thickness distribution, the resistance value of a small-thickness portion is a dominant factor which determines the series resistance of the overall intrinsic silicon-based thin-film.

For example, in the form shown in FIGS. 2 and 3, the top portions and bottom portions at which the intrinsic silicon-based thin-film has a smaller thickness as compared to the middle portions may serve as main paths of currents (photoexcited carriers). Therefore, series resistance stemming from the intrinsic silicon-based thin-film takes a value corresponding to the film thickness at each of the top portions and bottom portions, so that the series resistance becomes smaller as compared to a case where the film thickness is uniform. Comparison between the top portion and the bottom portion shows that the top portion has a smaller area. Therefore, when the film thickness on the top portion is locally decreased, it is possible to reduce series resistance while maintaining the average thickness of the overall intrinsic silicon-based thin-film, so that an effect of improving solar cell characteristics is easily obtained.

There is a small difference in current density and open circuit voltage depending on whether or not the intrinsic silicon-based thin-film has a thickness distribution at the same average thickness of the intrinsic silicon-based thin-film as described above. On the other hand, when a film thickness distribution is present, the fill factor tends to be larger as compared to a case where the film thickness is uniform.

Figure 4:
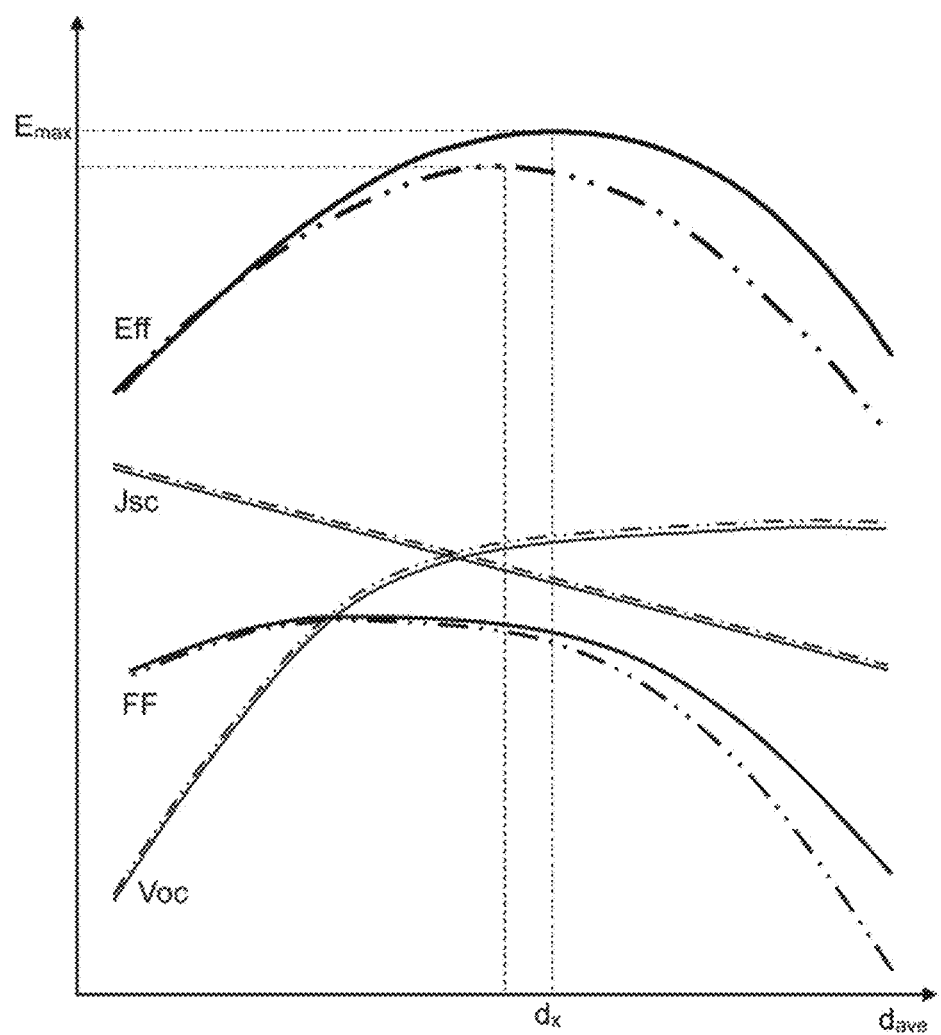
FIG. 4 is a diagram for illustrating a relationship between the thickness of the silicon-based thin-film and solar cell characteristics.

FIG. 4 is a diagram conceptually showing a relationship of a current density Jsc, an open circuit voltage Voc, a fill factor FF and a conversion efficiency Eff with an average thickness $d_{ave}$ of the intrinsic silicon-based thin-film (abscissa). The dashed line indicates a case where the intrinsic silicon-based thin-film has a uniform thickness, and the solid line indicates a case where the intrinsic silicon-based thin-film has a thickness distribution.

The light absorption loss increases as the thickness of the intrinsic silicon-based thin-film increases, and therefore the current density Jsc monotonously decreases as the average thickness $d_{ave}$ increases. The passivation effect on the crystalline silicon substrate is improved to increase the carrier lifetime as the thickness of the intrinsic silicon-based thin-film increases, and therefore the open circuit voltage Voc monotonously increases as the average thickness $d_{ave}$ increases. When the intrinsic silicon-based thin-film has a large thickness and hence the passivation effect on a surface of the crystalline silicon substrate is sufficiently improved, influences of carrier recombination in the crystalline silicon substrate become dominant. Therefore, when the average thickness $d_{ave}$ exceeds a predetermined value, the increasing tendency of the open circuit voltage Voc is saturated.

In a small-thickness region of the intrinsic silicon-based thin-film, the fill factor FF tends to increase as the open circuit voltage Voc increases, whereas in a region where the intrinsic silicon-based thin-film has a large thickness, since influences of an increase in series resistance are large, the fill factor FF decreases as the thickness increases. The film thickness may be exponentially related to series resistance, and when the film thickness exceeds a predetermined value, the fill factor FF tends to rapidly decrease.

The conversion efficiency Eff is represented by a product of Jsc, Voc and FF, and in a small-thickness region of the intrinsic silicon-based thin-film, the effect of improving the open circuit voltage Voc is dominant, and the conversion efficiency Eff tends to increase as the thickness increases. On the other hand, in a region where the intrinsic silicon-based thin-film has a large thickness, a decrease in fill factor FF is dominant, and therefore the conversion efficiency Eff tends to decrease as the thickness increases. In view of such a trade-off relationship, it is preferable to set the thickness of the intrinsic silicon-based thin-film so that, the conversion efficiency Eff reaches the maximum value Emax.

Regarding whether or not the intrinsic silicon-based thin-film has a thickness distribution, there is no clear difference in current density Jsc and open circuit voltage Voc depending on whether or not a thickness distribution is present. On the other hand, when a thickness distribution is present (solid line), the curve for the fill factor FF tends to be shifted to the right side (large-thickness side) as compared to a case where a thickness distribution is not present (dashed line).

Accordingly, when a thickness distribution is present, the thickness $d_x$ of the intrinsic silicon-based thin-film at which the conversion efficiency Eff reaches the maximum value Emax, and the maximum value Emax is larger as compared to a case where the intrinsic silicon-based thin-film does not have a thickness distribution.

Thus, when the intrinsic silicon-based thin-film has a thickness distribution, an increase in series resistance with an increase in thickness tends to be suppressed, and accordingly, the average thickness of the intrinsic silicon-based thin-film can be further increased, so that an advantage of improving the passivation effect is easily obtained. Therefore, a heterojunction solar cell having higher conversion efficiency is obtained.

Even when the intrinsic silicon-based thin-film on the crystalline silicon substrate has a thickness distribution, it may be impossible to sufficiently reduce series resistance because currents are locally concentrated if the distribution of small-thickness regions (regions serving as main paths of currents) is deviated. In one or more embodiments of the present invention, the thickness of the intrinsic silicon-based thin-film on the projection middle portions is different from the thickness of the intrinsic silicon-based thin-film on the projection top portions, and therefore a semi-periodic thickness distribution dependent on the projection-recess structure on a surface of the crystalline silicon substrate is present. Small-thickness regions serving as main paths of currents are semi-periodically present over the entire surface of the crystalline silicon substrate, and therefore local concentration of currents is suppressed, so that series resistance can be reduced in the entire surface of the crystalline silicon substrate.

For obtaining an effect of reducing series resistance by partial reduction of the film thickness, such a thickness distribution is preferred that the projections are arranged in a short period, and preferably a large number of small-thickness regions (regions serving as main paths of currents) are present per unit area. When the thickness on the projection top portions and the thickness on the projection bottom portions are each smaller than the thickness on the middle portions, there are a large number of small-thickness regions (top portions and bottom portions), and therefore an effect of reducing series resistance is easily obtained.

In one or more embodiments of the present invention, the number of small-thickness regions may be increased by increasing the number of projections (the number of pyramid top portions) by decreasing the size of projections formed on a surface of the crystalline silicon substrate. In other words, the number of projections increases as the size of projections s decreases, and accordingly, the number of regions where the silicon-based thin-film disposed on the projections has a small thickness increases. Therefore, the average height of projections of the projection-recess structure provided on a surface of the crystalline silicon substrate is preferably 10 µm or less, more preferably 5 µm or less. On the other hand, from the viewpoint of improving the optical confinement effect by the projection-recess structure, the average height of projections is preferably 0.5 µm or more, more preferably 1 µm or more.

The thickness difference between a large-thickness region and a small-thickness region of the silicon-based thin-film is not particularly limited. When the thickness difference (thickness distribution) is excessively large, a region having a locally low passivation effect on the crystalline silicon substrate may be formed, leading to reduction of the open circuit voltage. Therefore, even at the small-thickness regions (projection bottom portions and top portions), the thickness of the non-single-crystalline silicon-based thin-film 2 is preferably 3 nm or more, and the thickness of the intrinsic silicon-based thin-film 21 is preferably 1 nm or more.

From the same viewpoint as described above, the thickness of the non-single-crystalline silicon-based thin-film disposed on the small-thickness regions (projection top portions and projection bottom portions) is preferably not less than 0.75 times, more preferably not less than 0.80 times the thickness of the non-single-crystalline silicon-based thin-film disposed on the projection middle portions. For sufficiently exhibiting the effect of reducing series resistance by the thickness distribution, the thickness of the non-single-crystalline silicon-based thin-film disposed on the small-thickness regions (projection top portions and projection bottom portions) is preferably not more than 0.95 times, more preferably not more than 0.90 times the thickness of the non-single-crystalline silicon-based thin-film disposed on the projection middle portions.

In the non-single-crystalline silicon-based thin-film 2 including the intrinsic silicon-based thin-film 21 and the conductive silicon-based thin-film 22, the thickness of the intrinsic silicon-based thin-film 21 is a main factor that influences passivation of the crystalline silicon substrate and power generation characteristics such as series resistance. Therefore, for obtaining a heterojunction solar cell having high conversion efficiency, it is preferable to form the intrinsic silicon-based thin-film 21 having thickness distribution. In particular, the thickness $d_2$ of the intrinsic silicon-based thin-film disposed on the projection top portions of the crystalline silicon substrate and the thickness $d_3$ of the intrinsic silicon-based thin-film disposed on the projection bottom portions are each preferably smaller than the thickness $d_1$ of the intrinsic silicon-based thin-film disposed on the projection middle portions.

The thickness $d_2$ of the intrinsic silicon-based thin-film on the top portions is preferably 0.5 to 0.9 times, more preferably 0.55 to 0.85 times the thickness $d_1$ of the intrinsic silicon-based thin-film on the middle portions. The thickness $d_3$ of the intrinsic silicon-based thin-film on the bottom portions is preferably 0.5 to 0.9 times, more preferably 0.55 to 0.85 times the thickness $d_1$ of the intrinsic silicon-based thin-film on the middle portions.

On the other hand, for forming a diffusion potential uniformly in the surface, in one or more embodiments the uniformity of the thickness of the conductive silicon-based thin-film 22 is preferably high. The thickness $D_2$ of the conductive silicon-based thin-film on the top portions is preferably 0.8 to 1.2 times, more preferably 0.9 to 1.1 times the thickness $D_1$ of the conductive silicon-based thin-film on the middle portions. The thickness $D_3$ of the conductive silicon-based thin-film on the bottom portions is preferably 0.8 to 1.2 times, more preferably 0.9 to 1.1 times the thickness $D_1$ of the conductive silicon-based thin-film on the middle portions.

As described above, in one or more embodiments it is preferable that the intrinsic silicon-based thin-film 21 has a thickness distribution along the inclined surfaces of projections, whereas the conductive silicon-based thin-film has a uniform thickness. The ratio $(d_2/d_1)$ of the thickness $d_2$ of the intrinsic silicon-based thin-film on the top portions to the thickness $d_1$ of the intrinsic silicon-based thin-film on the projection middle portions of the crystalline silicon substrate and the ratio $(d_3/d_1)$ of the thickness $d_3$ of the intrinsic silicon-based thin-film on the bottom portions to the thickness $d_1$ of the intrinsic silicon-based thin-film on the middle portions are each preferably smaller than 1. On the other hand, the ratio ($D_2/D_1$) of the thickness $D_2$ of the conductive silicon-based thin-film on the top portions to the thickness $D_1$ of the conductive silicon-based thin-film on the projection middle portions of the crystalline silicon substrate and the ratio ($D_3/D_1$) of the thickness $D_3$ of the conductive silicon-based thin-film on the bottom portions to the thickness $D_1$ of the conductive silicon-based thin-film on the middle portions are each preferably a value close to 1.

Regarding the ratio between the thicknesses of the silicon-based thin-film on the projection middle portions and top portions of the crystalline silicon substrate, in one or more embodiments the ratio $d_2/d_1$ is preferably smaller than the ratio $D_2/D_1$. The ratio $d_2/d_1$ is preferably within a range of 0.5 to 0.9 tunes, more preferably 0.6 to 0.8 times the ratio $D_2/D_1$. Regarding the ratio between the thicknesses of the silicon-based thin-film on the projection middle portions and bottom portions of the crystalline silicon substrate, the ratio $d_3/d_1$ is preferably smaller than the ratio $D_3/D_1$. The ratio $d_3/d_1$ is preferably-within a range of 0.5 to 0.9 times, more preferably 0.6 to 0.8 times the ratio $D_3/D_1$.

For forming a silicon-based thin-film having a thickness distribution along the inclined surfaces of projections of the crystalline silicon substrate, deposition conditions are appropriately adjusted, or etching treatment is performed after deposition, for example. In a CVD method, a film is apt to grow in a normal direction to the inclined surface. Therefore, for generating a thickness distribution during deposition, for example, a method may be employed in which regions in the vicinity of the top portions and the bottom portions of the texture are locally covered with a mask.

For etching treatment after deposition, wet etching with various etchants, or dry etching such as hydrogen plasma etching, reactive ion etching (RIE) can be employed. For example, by disposing a protecting layer such as a resist so as to cover the bottom portions and middle portions and expose the top portions, and performing wet etching with an acidic solution of fluonitric acid or the like or an alkaline solution of sodium hydroxide or the like, or dry etching such as RIE, the thickness of the silicon-based thin-film on the top portions can be selectively decreased. For example, a liquid resist material is used, the protecting layer can be formed so as to expose the top portions by applying the resist with a thickness smaller than the height of the texture.

In dry etching, when etching treatment is performed in an oblique direction, the middle portions and bottom portions are hardly etched because they are hidden by projections of the texture, and thus the top portions can be selectively etched to decrease the film thickness. In hydrogen plasma etching, an intrinsic silicon-based thin-film is deposited by a plasma-enhanced CVD method, and hydrogen is then introduced into a CVD chamber to perform plasma discharge. By adjusting the pressure, plasma power and the like during hydrogen plasma etching, the thickness of the intrinsic silicon-based thin-film on the projection top portions can be selectively decreased.

The reason why the film thickness on the top portions is selectively decreased by hydrogen plasma treatment may be that the film thickness distribution is dependent on the probability that atoms etched by hydrogen plasma are redeposited on the silicon-based thin-film. Since the mean free path of high-energy atoms etched by hydrogen plasma is larger than the size of projections of the crystalline silicon substrate, there is a low probability that atoms flying out of the projection top portions are confined within the projection-recess structure. On the other hand, there is a high probability that atoms flying out of the projection middle portions and bottom portions collide against the inclined surfaces of adjacent projections, and therefore there may be a high probability that the atoms lose energy in repetition of collision, and are redeposited on the silicon-based thin-film. It is supposed that due to such a difference in redeposition probability, the amount of decrease in film thickness on the top portions by hydrogen plasma treatment is greater than the amount of decrease in film thickness on the middle portions and bottom portions.

As shown in the Patent Document 1 (WO 98/43304) discussed above and Comparative Examples 1 to 3 described below, the thickness of a silicon-based thin-film on projections of a crystalline silicon substrate formed by plasma-enhanced CVD deposition under general conditions (e.g., introduction of a silicon-containing gas at a hydrogen dilution ratio of 100 or less) satisfies the relationship: thickness on top portions>thickness on middle portions>thickness on bottom portions. In hydrogen plasma treatment, the amount of decrease in film thickness on the top portions is high, and therefore when the plasma power density and treatment time are increased, the thickness on the top portions becomes smaller than the thickness on the middle portions.

The thickness distribution of the thin-film along the inclined surfaces of projections can also adjusted by performing hydrogen plasma treatment while introducing hydrogen and a small amount of silicon-containing gas into a chamber instead of hydrogen plasma etching in which only hydrogen is introduced.

In the hydrogen plasma etching of one or more embodiments in which only hydrogen is introduced, the thickness of the silicon-based thin-film is decreased under the action of hydrogen plasma. When plasma power is applied while hydrogen and a silicon-containing gas are introduced at a hydrogen dilution ratio of 100 or less, a silicon-based thin-film is deposited. When plasma power is applied under an atmosphere at a high hydrogen concentration while in addition to hydrogen, a silicon-containing gas is introduced in an amount smaller than that under general deposition conditions, etching by hydrogen plasma and CVD deposition with a silicon-containing gas present in the atmosphere competitively occur in parallel. At a high hydrogen dilution ratio (e.g., 500 or more), hydrogen plasma etching is dominant, so that the average thickness of the silicon-based thin-film decreases, whereas at a low hydrogen dilution ratio (e.g., about 150 to 500), deposition is dominant, so that the average thickness of the silicon-based thin-film increases.

In one or more embodiments when hydrogen plasma treatment is performed while a small amount of silicon raw material gas is introduced, the projection top portions are considerably influenced by hydrogen plasma etching as in the case of hydrogen plasma etching in which only hydrogen is introduced. When hydrogen plasma treatment causes an increase in average thickness, an increase in thickness on the top portions is relatively small as compared to the amount of increase in thickness on the bottom portions and the middle portions. The thickness on the top portions may decrease while the thickness on bottom portions and middle portions increases. The average thickness decreases when hydrogen plasma treatment is performed under the condition of a higher hydrogen dilution ratio. In this case, the amount of decrease in thickness on the top portions is larger than the amount of decrease in thickness on the middle portions and the bottom portions. By adjusting the conditions and time of hydrogen plasma treatment, a silicon-based thin-film is obtained in which the thickness on the top portions and the thickness on the bottom portions are each smaller than the thickness on the middle portions.

In the hydrogen plasma treatment of one or more embodiments in which a small amount of silicon-containing gas is added, it is possible to more strictly control the film thickness distribution because the thickness change rate is lower as compared to hydrogen plasma etching in which only hydrogen is used. In addition, in hydrogen plasma treatment in which a small amount of silicon-containing gas is added, a variation in thickness within one batch and between plural batches in mass production of solar cells tends to be smaller as compared to hydrogen plasma etching in which only hydrogen is used.

In the mass production of heterojunction solar cells of one or more embodiments, generally a plurality of crystalline silicon substrates are mounted on a deposition tray, and a silicon-based thin-film is formed on a plurality of crystalline silicon substrates in one batch by a plasma-enhanced CVD method. Even when hydrogen plasma treatment is performed during or after deposition of the silicon-based thin-film, the treatment is performed on a plurality of substrates in one batch. When deposition and hydrogen plasma etching are continuously performed in a plurality of batches while deposition trays on which the crystalline silicon substrate is mounted are replaced, a difference in thickness of the silicon-based thin-film (thickness variation within one batch) between a substrate mounted at the center on the tray and a substrate in the vicinity of the end portion on the tray tends to increase with an increase in the number of continuous deposition batches. In. addition, a variation in thickness between plural batches tends to increase with an increase in the number of continuous deposition batches. When hydrogen plasma treatment is performed while a small amount of silicon-containing gas is added and introduced into a chamber in addition to hydrogen, a variation in thickness within a batch and between batches can be reduced even when the number of continuous deposition batches increases.

For reducing a variation in thickness within one batch and among plural bathes, the introduction amount of the silicon-containing gas in hydrogen plasma treatment is preferably not less than 1/3000, more preferably not less than 1/1500, further preferably not less than 1/1000, especially preferably not less than 1/800 of the introduction amount of hydrogen. For ensuring that the amount of decrease in thickness of the intrinsic silicon-based thin-film formed on the projection top portions is made relatively large, so that the thickness on the top portions is smaller than the thickness on the middle portions, the introduction amount of the silicon-containing gas is preferably not more than 1/150, more preferably not more than 1/200, further preferably not more than 1/250, especially preferably not more than 1/300. In other words, the hydrogen dilution ratio of the silicon-containing gas in hydrogen plasma treatment is preferably 150 to 3000, more preferably 200 to 1500, further preferably 250 to 1000, especially preferably 300 to 800.

For ensuring that the thickness of the intrinsic silicon-based thin-film disposed on the projection top portions is made relatively small under the action of hydrogen plasma, the plasma power density is preferably 55 mW/cm$^2$ or more, more preferably 60 mW/cm$^2$ or more, further preferably 70 mW/cm$^2$ or more, especially preferably 80 mW/cm$^2$ or more. On the other hand, when the power density during plasma treatment is excessively high, it may be difficult to control the thickness due to an increase in etching rate, or film quality may be deteriorated. Therefore, the plasma power density is preferably 1000 mW/cm$^2$ or less, more preferably 800 mW/cm$^2$ or less, further preferably 600 mW/cm$^2$ or less, especially preferably 500 mW/cm$^2$ or less.

Hydrogen plasma treatment may be performed after deposition of the whole thickness of the intrinsic silicon-based thin-film, or performed after formation of a partial thickness portion of the intrinsic silicon-based thin-film. A partial thickness portion of the intrinsic silicon-based thin-film may be formed, followed by performing hydrogen plasma treatment, and then forming the remaining thickness portion of the intrinsic silicon-based thin-film. A partial thickness portion of the intrinsic silicon-based thin-film may be formed, followed by performing hydrogen plasma treatment, forming the remaining thickness portion of the intrinsic silicon-based thin-film, and then performing hydrogen plasma treatment again. The hydrogen plasma treatment after formation of a partial thickness portion of the intrinsic silicon-based thin-film is performed in a state in which the silicon-based thin-film on the crystalline silicon substrate has a small thickness (e.g., about 1 to 5 nm). Therefore, not only the thickness distribution of the silicon-based thin-film along the inclined surfaces of projections can be adjusted, hut also a passivation effect by hydrogen plasma can be exerted on an interface between the crystalline silicon substrate and the silicon-based thin-film, so that solar cell characteristics tend to be further improved.

As described above, it is preferable that the conductive silicon-based thin-film 22 has a small difference between the thickness $D_2$ on the top portions and the thickness $D_1$ on the middle portions and the thickness $D_3$ on the bottom portions, and thus has a uniform thickness. When the conductive silicon-based thin-film is deposited by CVD under general conditions, the thickness $D_2$ on the top portions tend to be larger than each of the thickness $D_1$ on the middle portions and the thickness $D_3$ on the bottom portions, leading to an increase in series resistance. By adjustment of deposition conditions, etching treatment after deposition or the like, the thickness distribution of the conductive silicon-based thin-film can be adjusted.

For example, when deposition is performed while hydrogen is introduced in addition to the silicon-containing gas, a difference between the thickness $D_2$ on the top portions and the thickness $D_1$ on the middle portions tends to decrease. More specifically, when CVD deposition is performed while hydrogen is introduced in an amount 1 to 150 times the amount of the silicon-containing gas, a difference between the thickness on the top portions and the thickness on the middle portions on the conductive silicon-based thin-film tends to decrease. In addition, deposition may be performed while hydrogen is introduced in an amount 150 to 3000 times the amount of the silicon-containing gas, followed by performing deposition while introducing hydrogen in an amount 1 to 150 times the amount of the silicon-containing gas. Deposition may be performed while hydrogen is introduced in an amount 1 to 150 times the amount of the silicon-containing gas, followed by performing deposition while introducing hydrogen in an amount 150 to 3000 times the amount of the silicon-containing gas.

In the crystalline silicon-based solar cell according to one or more embodiments of the present invention, the silicon-based thin-film has a thickness distribution along the inclined surfaces of projections as described above. Since the projection-recess structure of the crystalline silicon substrate is provided mainly on the light-receiving side, it is preferable that the silicon-based thin-film on the light-receiving side has a thickness distribution along the inclined surfaces of projections. When the projection-recess structure is provided on both surfaces of the crystalline silicon substrate, any one of silicon-based thin-films on the light-receiving side and on the back side may have a thickness distribution along the inclined surfaces of projections, or silicon-based thin-films on both sides may have a thickness distribution along the inclined surfaces of projections.

As long as the silicon-based thin-film has a thickness distribution along the inclined surfaces of projections, the crystalline silicon-based solar cell can be prepared using known materials and a known method. The transparent electroconductive layers 3 and 5 disposed on the non-single-crystalline silicon-based thin-films 2 and 4 are each preferably a thin-film composed of a transparent conductive metal oxide such as ITO or ZnO. The thickness of the transparent electroconductive layer is set to about 10 to 140 nm. The transparent electroconductive layer can be formed by a dry process such as a sputtering method, an ion plating method, an electron beam vapor deposition method or a CVD method, a wet process using an electroconductive ink, or the like. In particular, a sputtering method is suitable for deposition of an indium-based oxide layer such as an ITO layer.

When the silicon-based thin-film has a thickness distribution along the inclined surfaces of projections, photoexcited carriers generated in the crystalline silicon substrate tend to intensively to regions where the silicon-based thin-film has a small thickness, and series resistance is low. Further power enhancement by improvement of carrier extraction efficiency can be expected when contact resistance between the silicon-based thin-film and the transparent electroconductive layer is reduced in regions to which the carriers flow intensively.

By increasing the carrier concentration of the transparent electroconductive layer, contact resistance at the interface can be reduced. When the concentration of a dopant metal in the transparent electroconductive layer (e.g., tin in ITO) is high, or the content of a crystalline component (crystallinity degree) is high, the carrier concentration tends to increase. On the other hand, when the carrier concentration of the transparent electroconductive layer increases, absorption of light in an infrared range by the transparent electroconductive layer may increase, leading to reduction of a short circuit current in the solar cell.

For suppressing absorption of light by the transparent electroconductive layer and improving photoinduced carrier extraction efficiency by reduction of contact resistance, in one or more embodiments it is preferable to locally increase the carrier concentration of the transparent electroconductive layer in regions where the silicon-based thin-film has a small thickness and thus flow of photoinduced carriers is enhanced. Specifically; it is preferable that the carrier concentration of the transparent electroconductive layer on the projection top portions is made relatively high.

For example, when the transparent electroconductive layer on the projection top portions is selectively crystallized to have a crystallization ratio higher than that of the transparent electroconductive layer on other regions (projection middle portions and projection bottom portions), the carrier concentration of the transparent electroconductive layer on the projection top portions becomes relatively high. When deposition is performed under the same conditions, the metal oxide of the transparent electroconductive layer is apt to be more crystallized as the thickness of the transparent electroconductive layer increases. In general deposition, the thickness tends to be larger on the projection top portions than on other regions (middle portions and projection bottom portions). Therefore, as a result of adjusting the deposition thickness, the film on the top portions where the thickness is relatively large is crystalline, and the film on the middle portions and the bottom portions has a relatively low crystallization ratio, or is amorphous. For promoting crystallization, the thickness of the transparent electroconductive layer on the projection top portions is preferably 15 nm or more. The thickness of the transparent electroconductive layer on the projection top portions is preferably not less than 1.2 times, more preferably not less than 1.3 times the thickness of the transparent electroconductive layer on the projection bottom portions. From the viewpoint of reducing absorption of light by the transparent electroconductive layer, the thickness of transparent electroconductive layer on the projection top portions is preferably 60 nm or less, more preferably 40 nm or less.

For producing a crystalline component, in one or more embodiments the dopant metal content of the transparent electroconductive layer is preferably small. The dopant metal content of the transparent electroconductive layer is preferably (6% by weight or less, more preferably 4% by weight or less. On the other hand, from the viewpoint of reduction of resistance, the dopant metal concentration of the transparent electroconductive layer is preferably 1% by weight or more, more preferably 1.5% by weight or more.

When the transparent electroconductive layer on the projection top is selectively crystallized, the crystallization ratio of the transparent electroconductive layer on the top portions is preferably 20% or more, more preferably 30% or more. The crystallization ratio is calculated from the area ratio of the transparent electroconductive layer which remains without being dissolved after the transparent electroconductive layer is immersed in 10% hydrochloric acid at 25° C. for 20 seconds (etching of an amorphous component with an acid).

Metal electrodes 7 and 8 are disposed on the transparent electroconductive layers 3 and 5 for current extraction. The metal electrode on the light-receiving side is patterned in a predetermined shape. The metal electrode on the back side may be formed over the entire surface of the transparent electroconductive layer, or formed in a pattern shape. The patterned collecting electrode can be prepared by various printing methods, plating methods and the like.

While an example of a heterojunction solar cell with an electrode on both sides as shown in FIG. 1 is mainly described above, one or more embodiments of the present invention is also applicable to a back contact-type heterojunction solar cell having an electrode only on the back side. The back contact-type heterojunction solar cell has no electrode on the light-receiving side of a crystalline silicon substrate, and has a p-type silicon-based thin-film and an n-type silicon-based thin-film on the back side, and an electrode on each conductive silicon-based thin-film. When an intrinsic silicon-based thin-film disposed between the crystalline silicon substrate and the conductive silicon-based thin-film has a thickness distribution along the inclined surfaces of projections in the back contact-type solar cell having projection-recess structure on the back side (electrode-formed surface) of the crystalline silicon substrate, it is possible to contribute to improvement of conversion efficiency by reduction of series resistance as in the vase of the solar cell with an electrode on both sides.

Preferably, the crystalline silicon-based solar cell according to one or more embodiments of the present invention is modularized when put to practical use. Modularization of the solar cell is performed by an appropriate method. For example, metal electrodes of adjacent solar cells (cells) are connected via an interconnector to connect a plurality of cells in series or in parallel, and encapsulation is then performed to obtain a solar cell module.

EXAMPLES

One or more embodiments of the present invention will be described in more detail by way of comparison of Examples with Comparative Examples, but the present invention is not limited to the following examples.

Comparative Examples 1 to 3

(Formation of Texture on Crystalline Silicon Substrate)

A 200 μm-thick 6-inch n-type single-crystalline silicon substrate having a light-incident surface identical to the (100) plane was washed in acetone, then immersed in a 2 wt % HF aqueous solution for 3 minutes to remove a silicon oxide film on surfaces of the wafer, and rinsed with ultrapure water. The washed crystalline silicon substrate was immersed in a 5/15 wt % KOH/isopropyl alcohol. aqueous solution at 70° C. for 15 minutes, and rinsed with ultrapure water to obtain a crystalline silicon substrate having a pyramidal texture on which the (111) plane is exposed.

(Deposition of Light-Receiving Side Silicon Thin-Film)

A crystalline silicon substrate provided with a texture was mounted on a central mounting position of a deposition tray (tray area: 0.93 m$^2$, deposition surface area: 0.67 m$^2$) with 25 crystalline silicon substrates mountable thereon, the deposition tray was introduced into a CVD chamber, and deposition was performed for 15 seconds under the condition of a substrate temperature of 150° C., a pressure of 120 Pa, an $H_2/SiH_4$ flow rate ratio of 10/3 and a power density of 11 mW/cm$^2$ to form a light-receiving side intrinsic silicon thin-film. The deposition time was adjusted so that the thickness of the intrinsic silicon-based thin-film on the middle portions was about 4 nm (Comparative Example 1), about 5 nm (Comparative Example 2) or about 6 nm (Comparative Example 3).

On the intrinsic silicon thin-film, a p-type silicon thin-film having a thickness of about 3 nm on the middle portions was formed under the condition of a substrate temperature of 150° C., a pressure of 60 Pa, a $B_2H_6$-containing $H_2/SiH_4$ flow rate ratio of 3/1 and a power density of 11 mW/cm$^2$. As $B_2H_6$-containing $H_2$, a mixed gas with the $B_2H_6$ concentration reduced to 5000 ppm by dilution with $H_2$ was used.

(Deposition of Back Side Silicon Thin-Film)

The crystalline silicon substrate was turned back, a back surface intrinsic silicon thin-film having a thickness of about 6 nm on the middle portions was formed under the condition identical to that for formation of the light-receiving side intrinsic silicon thin-film, and an n-type amorphous silicon thin-film having a thickness of about 4 nm was formed thereon under the condition of a substrate temperature of 150° C., a pressure of 60 Pa, a $PH_3$-containing $H_2/SiH_4$ flow rate ratio of 3/1 and a power density of 11 mW/cm$^2$. As $PH_3$-containing $H_2$, a mixed gas with the $PH_3$ concentration reduced to 5000 ppm by dilution with $H_2$ was used.

(Formation of Electrode)

An ITO transparent electroconductive layer having a thickness of 80 nm on the projection top portions (a thickness of 55 nm on the bottom portions) was deposited on each of the n-type silicon thin-film and the p-type silicon thin-film. The transparent electroconductive layer was deposited under the condition of a substrate temperature of 150° C., an argon/oxygen flow rate of 50 sccm/1 sccm, a pressure of 0.2 Pa and a power density of 0.5 W/cm$^2$ by a sputtering method using an ITO sintered target having a tin oxide content of 10% by weight. A silver paste was applied in a comb-like shape on the transparent electroconductive layer by screen printing, and heated at 150° C. for 1 hour to obtain a heterojunction solar cell.

Examples 1 to 3

In Examples 1 to 3, hydrogen plasma treatment was performed after deposition of a light-receiving side intrinsic silicon thin-film in the following manner, so that the thickness of the intrinsic silicon thin-film along the inclined surface of the texture had a distribution. A heterojunction solar cell was prepared in the same manner as in Comparative Examples 1 to 3 except for the above.

In deposition of the light-receiving side silicon thin-film, the deposition time was adjusted so that the thickness on the light-receiving side intrinsic silicon thin-film on the middle portions was about 10 nm (Example 1), about 11 nm (Example 2) or about 13 nm (Example 3). After formation of the intrinsic silicon thin-film, plasma discharge was temporarily stopped. The supply of $SiH_4$ was stopped, and only a hydrogen gas was introduced into the CVD chamber to perform gas replacement for 30 seconds. Thereafter, plasma discharge was started at a power density of 200 mW/cm$^2$, and hydrogen plasma treatment (hydrogen plasma etching) was performed for 20 seconds under the condition of a pressure of 520 Pa.

On the light-receiving side intrinsic silicon thin-film after hydrogen plasma treatment, a p-type silicon thin-film having a thickness of about 3 nm on the middle portions was formed under the condition identical to that in Comparative Examples 1 to 3.

[Evaluation]

A mini module including one heterojunction solar cell obtained in each of Examples and Comparative Examples was prepared, and conversion characteristics were measured under photoirradiation with an AM 1.5 and 100 mW/cm$^2$ at a sample temperature of 25° C. The mini module was prepared by disposing an encapsulant on both surfaces of the heterojunction solar cell with a wiring member connected to front and back electrodes, and disposing glass on the light-receiving surface and a back sheet on the back surface to encapsulate the heterojunction solar cell. After measurement of conversion characteristics, the mini module was disassembled, and a cross-section of the solar cell was observed with a transmission electron microscope (TEM) to determine the thickness of the silicon thin-film (total thickness of the intrinsic silicon thin-film and the p-type thin-film) on the top portions, the middle portions and the bottom portions of the texture on the light-receiving side.

The thickness of the light-receiving side silicon thin-film and the conversion characteristics of the mini module are shown in Table 1. Table 1 also shows the ratio of the thickness of the silicon thin-film on each of the top portions and the bottom portions to the thickness of the silicon thin-film on the middle portions on the light-receiving side of the heterojunction cell in each of Examples and Comparative Examples. The average thickness was calculated as a sum of 1/36 of the thickness on the top portions, 24/36 of the thickness on the middle portions and 11/36 of the thickness on the bottom portions. The conversion characteristics (open circuit voltage (Voc), current (Isc), fill factor (FF) and maximum power (Pmax)) in Table 1 are shown in terms of an increase or decrease (%) with respect to a value in Example 1.

TABLE 1

| | Light-receiving side silicon thin-film | | | | | | | | | |
|---|---|---|---|---|---|---|---|---|---|---|
| | Thickness (nm) | | | | Ratio to middle portion | | Conversion characteristics | | | |
| | Top portion | Middle portion | Bottom portion | Average | Top portion | Bottom portion | Voc | Isc | FF | Pmax |
| Comparative Example 1 | 9.2 | 6.9 | 6.2 | 6.7 | 1.34 | 0.98 | −2.1% | 0.3% | −0.6% | −2.4% |
| Comparative Example 2 | 10.7 | 8.0 | 7.5 | 7.9 | 1.33 | 0.99 | −0.1% | 0.1% | −2.5% | −2.6% |
| Comparative Example 3 | 12.5 | 9.0 | 8.3 | 8.9 | 1.39 | 0.99 | 0.3% | −0.1% | −4.8% | −4.6% |
| Example 1 | 8.1 | 8.7 | 7.3 | 8.3 | 0.93 | 0.95 | | | | — |
| Example 2 | 9.0 | 9.7 | 7.9 | 9.1 | 0.93 | 0.94 | 2.2% | −0.1% | −0.4% | 1.8% |
| Example 3 | 9.7 | 10.5 | 8.5 | 9.9 | 0.92 | 0.94 | 2.5% | −0.2% | −0.5% | 1.8% |

The solar cells in Examples 1 to 3 each exhibited conversion efficiency higher than that of the solar cells in Comparative Examples 1 to 3. The thickness of the silicon thin-film was larger on the top portions than on the middle portions of the texture in Comparative Examples 1 to 3, whereas the thickness of the silicon thin-film was smaller on the top portions than on the middle portions in the solar cells of Examples 1 to 3. The thickness of the silicon thin-film was smaller on the bottom portions than on the middle portions of the texture in the solar cells of Comparative Examples 1 to 3, and the thickness on the bottom portions tended to be more smaller in Examples 1 to 3 than in Comparative Examples 1 to 3.

Figure 5A:
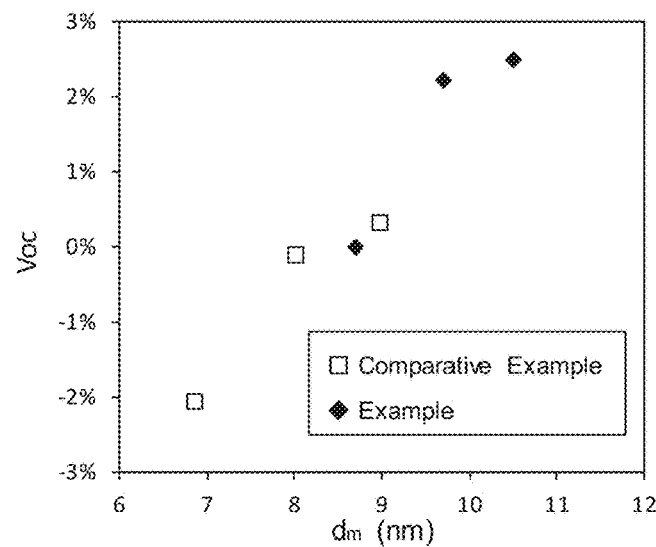
FIGS. 5A-C are graphs obtained by plotting a relationship between the thickness of the silicon thin-film on the middle portion and the conversion. characteristics of the solar cell in the Examples and Comparative Examples.
Figure 5B:
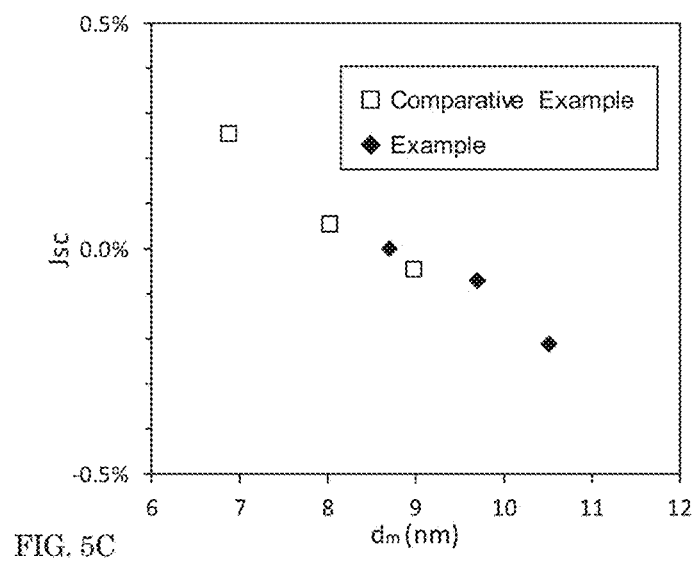
Figure 5C:
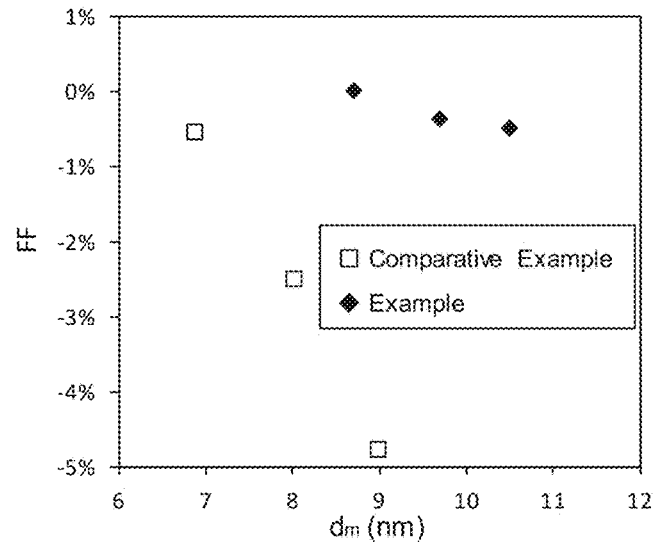

FIGS. 5A-C are graphs that have been obtained by plotting a relationship between the thickness $d_m$ of the silicon thin-film on the middle portions and the conversion characteristics. The open circuit voltage Voc tends to increase and the short-circuit current Isc tends to decrease with an increase in thickness $d_m$ of the silicon thin-film. These tendencies may be ascribable to improvement of a passivation effect due to an increase in film thickness and absorption of light by the silicon-based thin-film.

The factor FF tends to decrease with an increase in thickness $d_m$ of the silicon thin-film on the middle portions. This may be related to the fact that series resistance increased with an increase in film thickness. The tendency of increase or decrease in the fill factor FF in relation to an increase or decrease in film thickness was different between Examples and Comparative Examples, and the factor FF was higher in Examples than in Comparative Examples at the same thickness $d_m$ of the silicon thin-film on the middle portions.

Figure 6:
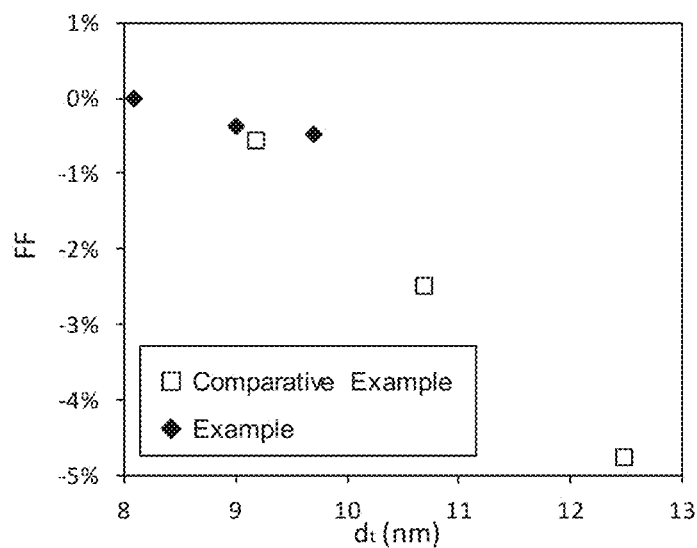
FIG. 6 is a graph obtained by plotting a relationship between the thickness of the silicon thin-film on the top portion and the fill factor of the solar cell in the Examples and Comparative Examples.

The graphs obtained by plotting the open circuit voltage Voc, the short-circuit current Isc and the fill factor FF against the average thickness of the silicon-based thin-film showed the same tendency as in FIGS. 5A-C (data is not shown). On the other hand, with reference to FIG. 6 in which the relationship between the thickness $d_t$ of the silicon thin-film on the top portions of the texture and the fill factor FF is plotted, an Example and a Comparative Example being equal in thickness $d_t$ achieved almost the same factors FF.

The above results show that the thickness of the intrinsic silicon thin-film on the top portions of the texture is a dominant factor which determines the fill factor FF of the solar cell, and even when the silicon thin-film on the middle portions of the texture has a large thickness, the fill factor FF is improved by decreasing the thickness on the top portions.

As shown in FIGS. 5A-C, the open circuit voltage Voc tends to increase and the short-circuit current Isc tends to decrease with an increase in thickness of the silicon thin-film on the middle portions of the texture, and the open circuit voltage Voc increases with a larger change behavior. Therefore, it is apparent that when while the thickness of the silicon thin-film on the middle portions is increased to improve the open circuit voltage Voc, the thickness of the silicon thin-film on the top portions is decreased to prevent a decrease in fill factor FF, a solar cell having high conversion efficiency is obtained.

[Examination of Hydrogen Plasma Treatment Conditions]

As described below, hydrogen plasma treatment was performed while a small amount of SiH$_4$ was introduced in addition to hydrogen after deposition of a light-receiving side intrinsic silicon thin-film in the following manner, so that the thickness distribution of the intrinsic silicon thin-film along the inclined surface of the texture was adjusted.

Examples 4 to 6

Except that the deposition time was adjusted so that the thickness on the middle portions was about 4.5 nm, the same procedure as in Comparative Example 1 was carried out to prepare an intrinsic silicon thin-film, and after the intrinsic silicon thin-film was formed, plasma discharge was temporarily stopped. The supply of SiH$_4$ was stopped, and only a hydrogen gas was introduced into the CVD chamber to perform gas replacement for 30 seconds. Thereafter, SiH$_4$ was introduced into a CVD chamber at a flow rate of 0.3% (hydrogen dilution ratio: 333) based on the flow rate of hydrogen, plasma discharge was started at a power density of 200 mW/cm$^2$, and hydrogen plasma treatment was performed under the condition of a pressure of 520 Pa. The hydrogen plasma treatment time was 20 seconds in Example 4, 40 seconds in Example 5 and 60 seconds in Example 6.

On the light-receiving side intrinsic silicon thin-film after hydrogen plasma treatment, a p-type silicon thin-film having a thickness of about 3 nm on the middle portions was formed under the condition identical to that in Comparative Examples 1 to 3, followed by depositing a back side silicon thin-film and forming an electrode to obtain a heterojunction solar cell.

Examples 7 to 9 and Comparative Example 4

An intrinsic silicon thin-film was deposited with the deposition time adjusted so that the thickness on the middle portions was about 5 nm in Comparative Example 4, about 7 nm in Example 7, about 8 nm in Example 8 or about 8.5 nm in Example 9. Thereafter, hydrogen plasma treatment was performed under the same conditions as in Example 4 except that the flow rate of $SiH_4$ based on the flow rate of hydrogen was 1% (hydrogen dilution ratio: 100) in Comparative Example 4, 0.2% (hydrogen dilution ratio: 500) in Example 7, 0.1% (hydrogen dilution ratio: 1000) in Example 8 and 0.05% (hydrogen dilution ratio: 2000) in Example 9. On the light-receiving side intrinsic silicon thin-film after hydrogen plasma treatment, a p-type silicon thin-film having a thickness of about 3 nm on the middle portions was formed under the condition identical to that in Comparative Examples 1 to 3, followed by depositing a back side silicon thin-film and forming an electrode to obtain a heterojunction solar cell.

[Evaluation]

Figure 7:
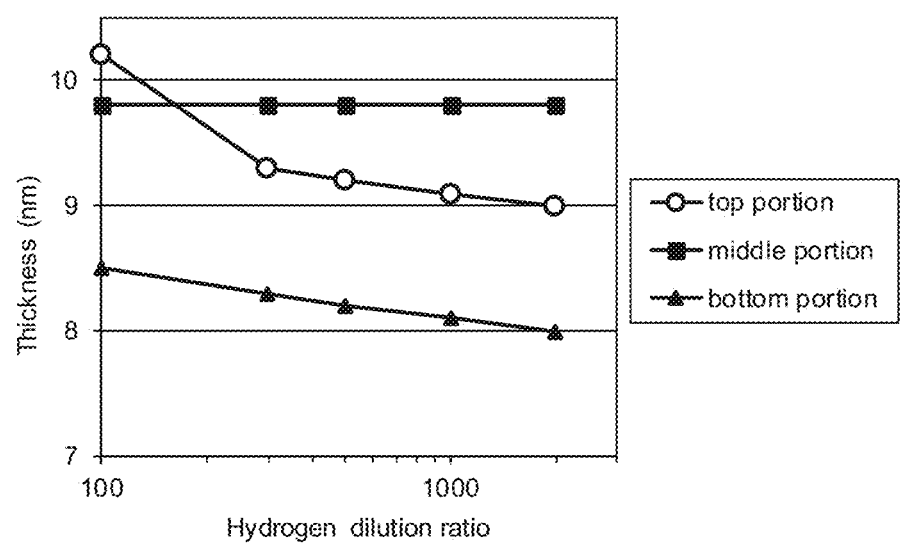
FIG. 7 is a graph obtained by plotting a relationship between the hydrogen plasma treatment time and the film thickness.
Figure 8:
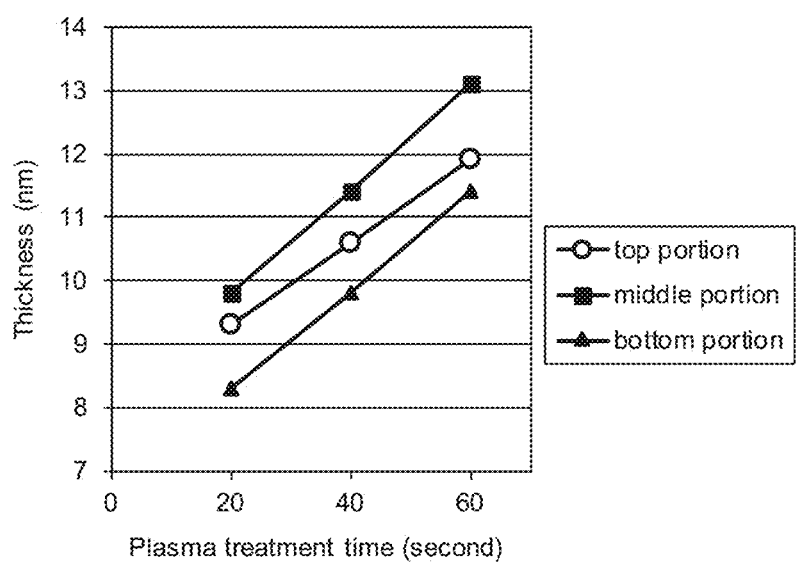
FIG. 8 is a graph obtained by semi-logarithmically plotting a relationship between the hydrogen dilution ratio in hydrogen plasma treatment and the film thickness.

Table 2 shows the thickness of the silicon thin-film (total thickness of the intrinsic silicon thin-film and the p-type silicon thin-film) on the top portions, the middle portions and the bottom portions of the texture on the light-receiving side for the heterojunction solar cells of Examples 4 to 9 and Comparative Example 4. FIG. 7 shows graphs obtained by plotting a relationship between the thickness on the top portions, the middle portions and the bottom portions and the hydrogen plasma treatment time in Examples 4 to 6; and FIG. 8 shows graphs obtained by semi-logarithmically plotting a relationship between the thickness on the top portions, the middle portions and the bottom portions and the hydrogen dilution ratio during hydrogen plasma treatment for Examples 4 and 7 to 9 and Comparative Example 4.

and deposition of the intrinsic silicon-based thin-film, hydrogen plasma treatment and deposition of the p-type silicon thin-film were performed in the same manner as in the first batch. The series of operations were repeated until treatment in the thousandth batch was completed. In Examples 7 to 9, Comparative Example 4 and Example 2, the same procedure as described above was carried out to perform treatment in the first to thousandth batches.

For each of Examples 2, 4 and 7 to 9 and Comparative Example 4, the thickness of the silicon thin-film (total thickness of the intrinsic silicon thin-film and the p-type silicon thin-film) on the bottom portions of the texture of each of two crystalline silicon substrates treated in the tenth batch and two crystalline silicon substrates treated in the thousandth batch was measured. The thickness of the silicon thin-film was determined by performing measurement for the bottom portions of three projections within a TEM observation region, and calculating the average value thereof. The difference between the thickness of the silicon-based thin-film on the substrate treated at the central portion of the tray in the tenth batch and the thickness of the silicon-based thin-film on the substrate treated at the central portion of the tray in the thousandth batch was expressed in terms of a percentage, and defined as a "variation between batches". The difference between the thickness of the silicon-based thin-film on the substrate treated at the central portion of the tray in the thousandth batch and the thickness of the silicon-based thin-film on the substrate treated at the end portion of the tray in the thousandth batch was expressed in terms of a percentage, and defined as a "variation within a batch". These values are shown in Table 2.

TABLE 2

| | Plasma treatment conditions | | Initial batch | | | | | | Conversion characteristics | | Continuous deposition thickness variation | |
|---|---|---|---|---|---|---|---|---|---|---|---|---|
| | | | Light-receiving side silicon thin-film | | | | | | | | | |
| | | | Thickness (nm) | | | Ratio to Middle portion | | | | | | |
| | Hydrogen dilution ratio | Time (seconds) | Top portion | Middle portion | Bottom portion | Top portion | Bottom portion | Voc (mV) | FF (%) | Within batch (%) | Between batches (%) |
| Example 4 | 333 | 20 | 9.3 | 9.8 | 8.3 | 0.95 | 0.85 | 739 | 80.0 | 0.1 | 0.2 |
| Example 5 | 333 | 40 | 10.6 | 11.4 | 9.8 | 0.93 | 0.86 | 744 | 80.0 | — | |
| Example 6 | 333 | 60 | 11.9 | 13.1 | 11.4 | 0.91 | 0.87 | 744 | 79.5 | — | |
| Example 7 | 500 | 20 | 9.2 | 9.8 | 8.2 | 0.94 | 0.84 | 740 | 80.0 | 0 | 0.1 |
| Example 8 | 1000 | 20 | 9.1 | 9.8 | 8.1 | 0.93 | 0.83 | 740 | 80.0 | 0 | 0.2 |
| Example 9 | 2000 | 20 | 9.0 | 9.8 | 8.0 | 0.92 | 0.82 | 740 | 80.0 | 7 | 0.4 |
| Comparative Example 4 | 100 | 20 | 10.2 | 9.8 | 8.5 | 1.04 | 0.87 | 723 | 78.5 | 1.1 | 1.3 |
| Example 2 | ∞ | 20 | 9.0 | 9.7 | 7.9 | 0.93 | 0.81 | 739 | 80.0 | 33.4 | 32.7 |

[Evaluation of Film Thickness During Continuous Deposition (Mass Production) in a Plurality of Batches]

A crystalline silicon substrate was mounted at each of two mounting positions on a deposition tray; namely one central position and one end position among 25 mounting positions. The deposition tray was introduced into a CVD chamber, and deposition of the intrinsic silicon-based thin-film, hydrogen plasma treatment and deposition of the p-type silicon thin-film were performed under the same conditions as in Example 4 (first batch). After completion of the first batch, the deposition tray was taken out from the CVD apparatus, another crystalline silicon substrate was mounted at each of the two mounting positions on the deposition tray, the deposition tray was introduced into the CVD chamber, FIG. 7 (Examples 4 to 6) shows that the thickness increases with an increase in plasma treatment time when the hydrogen dilution ratio during plasma treatment is 300. These results indicate that deposition with $SiH_4$ in an atmosphere is dominant over etching by hydrogen plasma in all of the projection top portions, middle portions and bottom portions. The amount of increase in thickness with respect to the plasma treatment time (gradient of graph) is smaller on the top portions than on the middle portions and the bottom portions. FIG. 8 (Examples 2, 4, 7 and 9) shows that when the hydrogen dilution ratio is 100, the thickness on the top portions is large because deposition is dominant, but the amount of decrease in thickness on the top portions tends to become larger in comparison with the thickness on the middle portions as the hydrogen dilution ratio during plasma treatment increases. Therefore, it is apparent that even when a small amount of silicon-containing gas is added, the thickness on the top portions can be made smaller than the thickness on the middle portions to improve the conversion efficiency of the solar cell as in the case of introducing only hydrogen.

Comparison between Example 2 in which plasma treatment was performed while only hydrogen was introduced and Examples 4 and 7 to 9 in which plasma treatment was performed while a small amount of $SiH_4$ was introduced shows that there was no significant difference in initial conversion characteristics. Regarding a variation in thickness when continuous deposition is performed in multiple batches, it is apparent that in Example 2, a variation between the tenth batch and the thousandth batch and a variation in the thousandth batch are markedly large. On the other hand, in Examples 4 and 7 to 9 in which plasma treatment was performed while $SiH_4$ was introduced, a variation within a batch and a variation in silicon thin-film between batches were small even when continuous deposition in multiple batches was performed in one CVD chamber, and thus excellent stability in mass production was exhibited.

[Examination of Thickness and Crystallinity of Transparent Electroconductive Layer and Power Generation Characteristics]

In Examples 10 to 12, an ITO sintered target having a tin oxide content of 2% by weight was used as an ITO target for formation of the transparent electroconductive layer, and the thickness was changed as shown in Table 3. A heterojunction solar cell was prepared in the same manner as in Example 2 except for the above. In Examples 13 and 14, a heterojunction solar cell was prepared in the same manner as in Example 2 except that the thickness of the transparent electroconductive layer was changed as shown in Table 3.

[Evaluation]

Table 3 shows the thickness and crystallinity of the transparent electroconductive layer on the light-receiving side of the heterojunction solar cell and the conversion characteristics of the mini module in Examples 10 to 14 and Example 2. The thickness and crystallinity of the transparent electroconductive layer were evaluated on the projection top portions and bottom portions. The conversion characteristics in Table 3 are shown in terms of an increase or decrease (%) with respect to a value in Example 2.

Figure 9A:
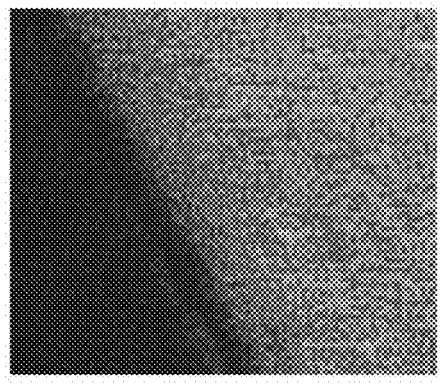
FIGS. 9A-B includes SEM observation images of a surface of an ITO transparent electroconductive layer before and after acid treatment.
Figure 9B:
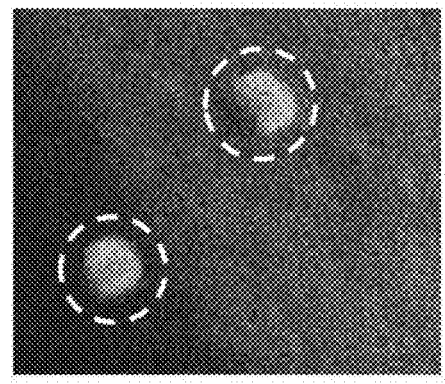

The solar cell was immersed in 10% hydrochloric acid at 25° C. for 20 seconds to perform acid treatment, and then washed with pure water, the surface thereof was observed with a scanning electron microscope (SEM) at a magnification of 50,000 times, and on the basis of the area ratio of the transparent electroconductive layer remaining after the acid treatment, the crystallinity of the transparent electroconductive layer was evaluated. FIG. 9A shows an example of a SEM image of the surface of the transparent electroconductive layer before acid treatment, and FIG. 9B shows an example of a SEM image of the surface of the transparent electroconductive layer after acid treatment. A crystalline component of the transparent electroconductive layer (ITO) which remains without being etched with hydrochloric acid is shown in each of circled sections in FIG. 9B. The transparent electroconductive layer was defined as being crystalline when the area ratio of a crystalline component, as shown in FIG. 9B, was 20% or more, and the transparent electroconductive layer was defined as being amorphous when the area ratio was less than 20%.

TABLE 3

|  | | Transparent electroconductive layer | | | | | | | |
|  | | Projection top portion | | Projection bottom portion | | Conversion characteristics | | | |
|  | Sn Content (wt %) | Thickness (nm) | Crystallinity | Thickness (nm) | Crsytallinity | Voc | Isc | FF | Pmax |
| Example 10 | 2 | 20 | Crystalline | 14 | Amorphous | 0.0% | 1.5% | −0.5% | 1.0% |
| Example 11 | 2 | 30 | Crystalline | 21 | Crystalline | 0.0% | 0.0% | 0.0% | 0.0% |
| Example 12 | 2 | 80 | Crystalline | 55 | Crystalline | 0.0% | −2.0% | 1.0% | −1.0% |
| Example 13 | 10 | 20 | Amorphous | 14 | Amorphous | 0.0% | 1.5% | −3.5% | −2.0% |
| Example 14 | 10 | 30 | Amorphous | 21 | Amorphous | 0.0% | 1.0% | −1.5% | −0.5% |
| Example 2 | 10 | 80 | Amorphous | 55 | Amorphous | — | | | |

In Examples 13 and 14 in which the transparent electroconductive layer had a thickness smaller than that in Example 2, the short-circuit current Isc increased with a decrease in amount of light absorbed by the transparent electroconductive layer, but the fill factor FF decreased with an increase in resistance of the transparent electroconductive layer, so that the power of the solar cell was lower than that of the solar cell in Example 2. In Example 12 with an ITO transparent electroconductive layer having a small tin oxide content, ITO was crystalline, so that the resistance of the transparent electroconductive layer was reduced, and the fill factor FF was improved as compared to Example 2, but the carrier concentration increased, so that the light absorption amount increased, leading to reduction of the short-circuit current Isc. In Example 11 in which the thickness of ITO was smaller than that in Example 12, conversion characteristics comparable to those in Example 2 were exhibited, and in comparison with Example 12, the short-circuit current Isc increased with a decrease in amount of light absorbed by the transparent electroconductive layer, and the fill factor FF decreased with an increase in resistance of the transparent electroconductive layer.

In Example 10 in which the thickness was further decreased, the bottom portions with a small thickness were amorphous, and the top portions with a large thickness were locally crystalline. In Example 10, the fill factor FF was reduced with a decrease in thickness of the transparent electroconductive layer, but there was a minor reduction in fill factor FF as compared to Example 13. It is considered that in Example 10, reduction of the fill factor FF with a decrease in thickness of the transparent electroconductive layer was suppressed because ITO on the top portions was locally crystalline, so that flow of photocarrier is locally enhanced.

Comparison between Example 11 and Example 14 with no difference in thickness of the transparent electroconductive layer and comparison between Example 12 and Example 2 with no difference in thickness of the transparent electroconductive layer show that Examples 14 and 2 in which the transparent electroconductive layer was an amorphous layer exhibited a higher short-circuit current Isc. This may be because the amorphous layer has a low carrier concentration and small light absorption. In Example 10, the transparent electroconductive layer on the top portions was crystalline, but the transparent electroconductive layer on the bottom portions was amorphous, and therefore a high short-circuit current Isc was exhibited as in the case of Example 13. In Example 10, reduction of the fill factor FF due to a decrease in thickness of the transparent electroconductive layer was suppressed because the transparent electroconductive layer on the projection top portions was crystalline as described above. Thus, when the projection top portions locally have a high crystallization ratio, both improvement of the fill factor FF and improvement of the short-circuit current Isc (reduction of light absorption) can be achieved to improve the power of the solar cell.

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

DESCRIPTION OF REFERENCE SIGNS

1 Crystalline silicon substrate
2, 4 Non-single-crystalline silicon-based thin-film
21, 41 Intrinsic silicon-based thin-film
22, 42 Conductive silicon-based thin-film
3, 5 Transparent electroconductive layer
7, 8 Metal electrode

What is claimed is:

1. A crystalline silicon-based solar cell, comprising, in the following order:
   a crystalline silicon substrate having a first principal surface;
   a non-single-crystalline silicon-based thin-film; and
   a transparent electroconductive layer,
   wherein the non-single-crystalline silicon-based thin-film and the transparent electroconductive layer are disposed on the first principal surface,
   wherein the non-single-crystalline silicon-based thin-film comprises, in the following order from the first principal surface, an intrinsic silicon-based thin-film and a conductive silicon-based thin-film,
   wherein the first principal surface has a plurality of pyramidal projections, each having a top portion, a middle portion, and a bottom portion,
   wherein a thickness of the non-single crystalline silicon-based thin-film disposed on the top portions is smaller than a thickness of the non-single-crystalline silicon-based thin-film disposed on the middle portions, and a thickness of the non-single crystalline silicon-based thin-film disposed on the bottom portions is smaller than the thickness of the non-single crystalline silicon-based thin-film disposed on the middle portions, and
   wherein a ratio $d_2/d_1$ is 0.5 to 0.9 times a ratio $D_2/D_1$, where $d_1$ is a thickness of the intrinsic silicon-based thin-film disposed on the middle portions, $d_2$ is a thickness of the intrinsic silicon-based thin-film disposed on the top portions, $D_1$ is a thickness of the conductive silicon-based thin-film disposed on the middle portions, and $D_2$ is a thickness of the conductive silicon-based thin-film disposed on the top portions.

2. The crystalline silicon-based solar cell according to claim 1, wherein the thickness of the non-single-crystalline silicon-based thin-film disposed on the top portions is 0.75 to 0.95 times the thickness of the non-single-crystalline silicon-based thin-film disposed on the middle portions.

3. The crystalline silicon-based solar cell according to claim 1, wherein the thickness of the non-single-crystalline silicon-based thin-film disposed on the bottom portions is 0.75 to 0.95 times the thickness of the non-single-crystalline silicon-based thin-film disposed on the middle portions.

4. The crystalline silicon-based solar cell according to claim 1, wherein a thickness of the intrinsic silicon-based thin-film disposed on the top portions is 0.5 to 0.9 times a thickness of the intrinsic silicon-based thin-film disposed on the middle portions.

5. The crystalline silicon-based solar cell according to claim 1, wherein a thickness of the intrinsic silicon-based thin-film disposed on the bottom portions is 0.5 to 0.9 times a thickness of the intrinsic silicon-based thin-film disposed on the middle portions.

6. The crystalline silicon-based solar cell according to claim 1,
   wherein a ratio $d_3/d_1$ is smaller than a ratio $D_3/D_1$,
      where $d_3$ is the thickness of the intrinsic silicon-based thin-film disposed on the bottom portions and $D_3$ is a thickness of the conductive silicon-based thin-film disposed on the bottom portions.

7. The crystalline silicon-based solar cell according to claim 6, wherein the ratio $d_3/d_1$ is 0.5 to 0.9 times the ratio $D_3/D_1$.

8. The crystalline silicon-based solar cell according to claim 1, wherein an average height of the plurality of pyramidal projections is 0.5 to 10 µm.

9. The crystalline silicon-based solar cell according to claim 1,
   wherein the transparent electroconductive layer disposed on the top portions is crystallized and has a larger crystallization ratio than both of a crystallization ratio of the transparent electroconductive layer disposed on the middle portions and a crystallization ratio of the transparent electroconductive layer disposed on the bottom portions.

10. A method for manufacturing a crystalline silicon-based solar cell, the method comprising:
    forming an intrinsic silicon-based thin-film on a first principal surface of a crystalline silicon substrate; and
    depositing a conductive silicon-based thin-film on the intrinsic silicon-based thin-film, thereby forming a non-single-crystalline silicon-based thin-film,
    wherein the crystalline silicon-based solar cell comprises, in the following order:
       the crystalline silicon substrate having the first principal surface;
       the non-single-crystalline silicon-based thin-film; and
       a transparent electroconductive layer,
    wherein the non-single-crystalline silicon-based thin-film and the transparent electroconductive layer are disposed on the first principal surface,
    wherein the non-single-crystalline silicon-based thin-film comprises, in the following order from the first principal surface, the intrinsic silicon-based thin-film and the conductive silicon-based thin-film, wherein the first principal surface has a plurality of pyramidal projections, each having a top portion, a middle portion, and a bottom portion, wherein a thickness of the non-single crystalline silicon-based thin-film disposed on the top portions is smaller than a thickness of the non-single-crystalline silicon-based thin-film disposed on the middle portions, and a thickness of the non-single crystalline silicon-based thin-film disposed on the bottom portions is smaller than the thickness of the non-single crystalline silicon-based thin-film disposed on the middle portions, and wherein a ratio $d_2/d_1$ is 0.5 to 0.9 times a ratio $D_2/D_1$, where $d_1$ is a thickness of the intrinsic silicon-based thin-film disposed on the middle portions, $d_2$ is a thickness of the intrinsic silicon-based thin-film disposed on the top portions, $D_1$ is a thickness of the conductive silicon-based thin-film disposed on the middle portions, and $D_2$ is a thickness of the conductive silicon-based thin-film disposed on the top portions.

11. A method for manufacturing the crystalline silicon-based solar cell according to claim 1, the method comprising:

forming the intrinsic silicon-based thin-film on the first principal surface having the plurality of pyramidal projections; and depositing the conductive silicon-based thin-film on the intrinsic silicon-based thin-film, thereby forming the non-single-crystalline silicon-based thin-film, wherein the non-crystalline silicon-based thin-film has a thickness on the top portions and a thickness on the bottom portions that are smaller than a thickness on the middle portions, and whereby the crystalline silicon-based solar cell of claim 1 is formed.

12. The method for manufacturing the crystalline silicon-based solar cell according to claim 10, wherein, before depositing the conductive silicon-based thin-film, the thickness of the intrinsic silicon-based thin-film on the top portions is 0.5 to 0.9 times the thickness of the intrinsic silicon-based thin-film on the middle portions.

13. The method for manufacturing the crystalline silicon-based solar cell according to claim 10, wherein the forming of the intrinsic silicon-based thin-film on the first principal surface is performed by a plasma-enhanced chemical vapor deposition (CVD) method in a CVD chamber, and, thereafter, subjecting the intrinsic silicon-based thin-film to a hydrogen plasma treatment, wherein the hydrogen plasma treatment comprises providing plasma discharge while hydrogen is introduced into the CVD chamber, and wherein the hydrogen plasma treatment forms the intrinsic silicon-based thin-film having the thickness on the top portions that is smaller than the thickness of the intrinsic silicon based thin-film on the middle portions.

14. The method for manufacturing the crystalline silicon-based solar cell according to claim 13, wherein the hydrogen plasma treatment further comprises introducing a silicon-containing gas into the CVD chamber, and wherein an amount of the silicon containing gas is 1/3000 to 1/150 of an amount of hydrogen.

* * * * *